US004001637B2

United States Statutory Invention Registration [19]

[11] Reg. Number: H1637

Offord et al.

[45] Published: Mar. 4, 1997

[54] LASER-ASSISTED FABRICATION OF BIPOLAR TRANSISTORS IN SILICON-ON-SAPPHIRE (SOS)

[76] Inventors: Bruce W. Offord, 4520 North Ave. #1, San Diego, Calif. 92116; Stephen D. Russell, 4561 Osprey St., San Diego, Calif. 92107; Kurt H. Weiner, 2 Heritage Village La., Campbell, Calif. 95008

[21] Appl. No.: 762,538

[22] Filed: Sep. 18, 1991

[51] Int. Cl.[6] ..... H01L 21/268

[52] U.S. Cl. ..... 437/173; 437/174; 148/DIG. 150; 148/DIG. 92; 148/DIG. 11

[58] Field of Search ..... 437/173, 174; 148/DIG. 150, DIG. 92, DIG. 11

[56] References Cited

U.S. PATENT DOCUMENTS

| | | |
|---|---|---|
| 3,943,555 | 3/1976 | Mueller et al. . |
| 3,974,560 | 8/1976 | Mueller . |
| 4,151,008 | 4/1979 | Kirkpatrick . |
| 4,249,960 | 2/1981 | Schnable . |
| 4,269,631 | 5/1981 | Anantha et al. . |
| 4,377,421 | 3/1983 | Wada et al. . |
| 4,490,211 | 12/1984 | Chen et al. . |
| 4,758,553 | 7/1988 | Magee et al. . |
| 4,775,641 | 10/1988 | Duffy et al. . |

OTHER PUBLICATIONS

L. D. Hess et al, "Laser–Assisted MOS/SOS Transistor Fabrication" in B. Appelton, et al eds, *Laser and Electron–Beam Interactions with Solids* Mat. Res. Soc. Symp. Proc. vol. 4, 1982 p. 633.

G. W. Cullen "The Preperation & Properties of Chemically Vapor Deposited Silicon on Sapphire & Spinel" J. Crystal Growth v.9 (1971) p. 107.

J. R. Abelson et al Epitaxial $Ge_xSi_{1-x}$/Si(100) Structures Produced by Pulsed Laser Mixing of Evaporated Ge on Si(100) Substrates Appl. Phys. Lett, v.52, 1988, p. 230.

(List continued on next page.)

*Primary Examiner*—Charles T. Jordan
*Assistant Examiner*—J. R. Hardee

[57] ABSTRACT

The fabrication of bipolar junction transistors in silicon-on-sapphire (SOS) relies upon the laser-assisted dopant activation in SOS. A patterned 100% aluminum mask whose function is to reflect laser light from regions where melting of the silicon is undesirable is provided on an SOS wafer to be processed. The wafer is placed within a wafer carrier that is evacuated and backfilled with an inert atmosphere and that is provided with a window transparent to the wavelength of the laser beam to allow illumination of the masked wafer when the carrier is inserted into a laser processing system. A pulsed laser (typically an excimer laser) beam is appropriately shaped and homogenized and one or more pulses are directed onto the wafer. The laser beam pulse energy and pulse duration are set to obtain the optimal fluence impinging on the wafer in order to achieve the desired melt duration and corresponding junction depth. Care must be taken since activation and rapid dopant redistribution occurs when the laser fluence is above the melt threshold and below the ablation threshold. Thus, bipolar junction transistors in SOS utilize a pulsed laser activation of ion implanted dopant atoms. Appropriate masking and pulsed laser illumination assures the electrical activation of the dopant without allowing undesirable diffusion either vertically along crystallographic defects (diffusion pipes) or laterally.

30 Claims, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

OTHER PUBLICATIONS

L. Jastrzebski "Origin and Control of Material Defects in Silicon VLSI Technologies: An Overview" IEEE Trans Electron Dev p. 475 (1982) V.ED–29.

G. Alestig, et al "CW Laser Annealing of Ion Implanted Oxidized Silicon Layers on Sapphire" Mat. Res. Soc. Symp Proc. vol. 13 p. 517 (1983).

G. A. Rozgonyi, et al "Structural & Electrical Properties of Epitaxial Si in Insulating Substrates" Appl. Phys. Lett. v. 55, p. 586 (1989).

D. C. Mayer, et al "A Short Channel CMOS/SOS Technology in Recrystallized 0.3 μm–Thick Silica–On Sapphire Flims" IEEE Electron Dev. Lett v.EDL–5 p. 15 (1984).

D. H. Loundes, et al "Pulsed Excimer Laser (308 nm) Annealing of Ion Implanted Silicon and Solar Cell Fabrication" Mat Res. Soc. Symp Proc. V13 p. 407 (1983).

M. E. Roulet, et al "Laser Annealing of Silicon on Sapphire" J Appl. Phys. 50(8), Aug. 1979 pp. 5536–5538.

S. Wolf, et al *Silicon Processing for The VLSI Era, vol. 1: Process Technology*; Latice Press Sunset Beach, CA (1986) pp. 153–155.

L. D. Hess, et al "Applications of Laser Annealing in IC Fabrication" Mat. Res Soc. Symp. Proc vol. 13, p. 337 (1983).

S. J. Duey et al "A Novel Quasi–Dielectrically Isolated Bipolar Transistor Using Epitaxial Lateral Overgrowth" in Jopke ed *Proceedings of the 1988 Bipolar Circuits & Technology Meeting* (1988) pp. 241–244.

R. J. Pressley's "Gas Immersion Laser Diffusion (GILDing)" in C C Tang, ed Laser Processing of Semiconductor Devices *Proc SPIE* v 385 p. 30 (1983).

S. Lau et al, "Improvement of Crystalline Quality of Epitaxial Si Layers by Ion Implantation Techniques" Appl Phys Lett vol. 34 p. 76 (1979).

M. Yamada, et al "Thermally Assisted Pulsed–Laser Annealing of SOS" in J. Gibbons et al, eds. *Laser & Electron–Beam Solid Interactions and Materials Processing*. Mat. Res Soc Symp Proc vol. 1 1981 p. 503.

D. Lubben et al "Laser–Induced Plasmas for Primary Ion Deposition of Epitaxial Ge & Si Films" J. Vac. Sci Tech. B, v.3 p. 968 (1985).

J. Jastrzebski "Silicon on Insulators: Different Approaches: A Review" J. of Crystal Growth vol. 70, 1984, p. 253.

S. D. Russell, et al "Excimer Laser–Assisted Etching of Silicon Using Chloropentafluoroethane" In. Rosenberg et al *In–Situ Patterning: Selective Area Deposition and Etching* Mater. Res. Soc. Proc. vol. 158 p. 325 (1990).

F. P. Heiman, et al "Silicon–On–Sapphire Epitaxial Bipolar Transistors" Solid State Electronics vol. 11, p. 411 (1968).

K. H. Weiner, et al "Thin–Base Bipolar Transistor Fabrication Using Gas Immersion Laser Doping" IEEE Elec. Dev Lett vol. 10 p. 260 (1989).

M. K El Ghor, et al, "Formation of Low Dislocation Density Silicon–on–Insulator by a Single Implantation and Annealing" Appl Phys Lett vol. 57, p. 156 1990.

A. E. Bell, "Review and Analysis of Laser Annealing" RCA Review, vol. 40, p. 295 (1979).

G. A. Garcia, et al "Electron Mobility within 100 nm of the Si/Sapphire Interface in Double–Solid Phase Epitaxially Regrown SOS." Electronics Letters v.22 p. 537 (1986).

LASER-ASSISTED FABRICATION OF BIPOLAR TRANSISTORS IN SILICON-ON-SAPPHIRE (SOS)

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Very Large Scale Integration (VLSI) of microelectronic devices and future downscaling of electronic systems require dielectric isolation to overcome problems associated with conventional junction isolation such as: latch-up, unscalable vertical dimensions, and increased leakage at elevated temperatures, see the artical by S. J. Duey and G. W. Neudeck, "A Novel Quasi-Dielectrically Isolated Bipolar Transistor Using Epitaxial Lateral Overgrowth", in J. Jopke, ed., *Proceddings of the* 1988 *Bipolar Circuits & Technology Meeting,* 1988, pp. 241–244. Methods to acieve this dielectric isolation are silicon-on-insulator (SOI) technologies. SOI technologies promise to offer increased device performance by reducing parasitic capacitance, interconnect delay, and increased radiation hardness. Many examples of SOI technologies are known, but with limited degrees of success and process maturity, for example, see the article by J. Jastrzebski, "Silicon on Insulators: Different Approaches: A Review", *J. Crystal Growth,* vol. 70, 1984, p. 253. In SOI technology, small islands of silicon which contain the individual device are fabricated on an insulating substrate, and then interconnected in the normal way. Likely to be attendant with these technologies is the difficulty, or inability to achieve "device quality" silicon on an insulating layer. Device quality is defined as silicon layers without crystallographic defects and/or impurities which prevent fabrication of functioning devices. One SOI technique employs the ion implantation of oxygen or nitrogen into bulk silicon forming a buried oxide ($SiO_2$) called the SIMOX process, as described by M. K. El-Ghor, S. J. Pennycook, F. Namavar, and N. H., Karam in "Formation of Low Dislocation Density Silicon-on-Insulator by a Single Implantation and Annealing", *Appl. Phys. Lett.,* vol. 57, 1990, p. 156, or a buried nitride ($Si_3N_4$) layer. Other techniques relied on deposited amorphous or polycrystalline silicon on an amorphous substrate and then recrystallized by various techniques such as laser annealing, electron beam annealing and radiant heating. These methods did not achieve high quality devices and the techniques have been subsequently abandoned, note S. Wolf and R. N. Tauber's *Silicon Processing for the VLSI Era,* Vol. 1: Process Technology, Lattice Press, Sunset Beach, Calif., pp. 153–5. Epitaxial Lateral Overgrowth (ELO) is a method which employs the growth of an oxide layer on bulk silicon, and subsequent selective epitaxial growth from nucleation sites on bare silicon in patterned openings and subsequent overgrowth on the remaining oxide, see Duey et al., supra. A similar technique called Zone Melt Recrystallization (ZMR) uses a moving filament to remelt silicon deposited on $SiO_2$ using patterned openings to the bulk Si below as a seed crystal for regrowth, note the article by G. A. Rozgonyi et al., "Structural and Electrical Properties of Epitaxial Si on Insulating Substrates", *Appl. Phys. Lett.,* vol. 55, 1989, p. 586.

Another technology that has been investigated employs epitaxially grown silicon-on-sapphire (SOS). Early attempts at fabricating device quality SOS have been documented, for example, see G. W. Cullen's "The Preparation and Properties of Chemically Vapor Deposited Silicon on Sapphire and Spinel", *J. Crystal Growth,* vol. 9, 1971, p. 107 and F. P. Heiman and P. H. Robinson's "Silicon-On-Sapphire Epitaxial Bipolar Transistors", *Solid State Electronics,* vol. 11, 1968, p. 411. This latter reference achieved low gain functional transistors, but noted that small area devices must be fabricated because of the high density of crystal imperfections that cause emitter-collector shorts. Since then, techniques have been developed to improve the near interfacial region for thin silicon layers on sapphire such as Solid-Phase-Epitaxy (SPE), Double-Solid-Phase-Epitaxy (DSPE) and Solid-Phase-Epitaxy-And-Regrowth (SPEAR), see for example, the article by S. Lau et al., "Improvement of Crystalline Quality of Epitaxial Si Layers by Ion Implantation Techniques", *Appl. Phys. Lett.,* Vol. 34, 1979, p. 76; G. A. Garcia and R. E. Reedy, "Electron Mobility within 100 nm of the Si/Sapphire Interface in Double-Solid-Phase Epitaxially Regrown SOS", *Electronics Letters,* Vol. 22, 1986, p. 537; and D. C. Mayer et al., "A Short-Channel CMOS/SOS Technology in Recrystallized 0.3 μm-thick Silicon-on-Sapphire Films", *IEEE Electron. Dev. Lett.,* Vol. EDL-5, 1984, p. 156. These techniques, however, do not provide device quality material for devices with more stringent materials requirements such as bipolar junction transistors, charge-coupled devices (CCDs), and others, requiring thicker films and high quality epitaxial layers, see L. Jastrzebski's "Origin and Control of Material Defects in Silicon VLSI Technologies: An Overview", *IEEE Trans. Electron Dev.,* Vol. ED-29, 1982, p. 475. Previous attempts at fabrication of bipolar devices in SOS have been blocked by materials defects. The inability to achieve silicon epitaxially grown on sapphire without dislocations, slip planes, and twin defects results in a failure mechanism for devices by means of what is known as "diffusion pipes". Diffusion pipes are crystallographic defects which allow paths for dopant atoms to diffuse (or migrate) during high temperature anneals. The anneals are critical in the processing of semiconductor devices in that they allow the electrical activation of ion implanted dopant atoms. Therefore the diffusion of dopant from one junction into another (e.g. the emitter to the base) results in leaky or shorted devices. Therefore, research and development into high quality crystalline films on sapphire and novel processing techniques are of continuing interest for SOS device fabrication.

Laser processing of materials has been investigated for a variety of applications, and is being used in semiconductor processing of silicon VLSI in applications which range from laser-assisted etching, as referred to in S. D. Russell and D. A. Sexton's "Excimer Laser-Assisted Etching of Silicon Using Chloropentafluoroethane", in R. Rosenberg et al., *In-Situ Patterning: Selective Area Deposition and Etching*" Mater. Res. Soc. Proc., vol. 158, 1990, p. 325; chemical vapor deposition (CVD), as referred to by D. Lubben et al. in "Laser-Induced Plasmas for Primary Ion Deposition of Epitaxial Ge and Si Films", *J. Vac. Sci. Technol.,* B, vol. 3, 1985, p. 968; and alloy formation, as referred to by J. R. Abelson et al. in "Epitaxial $Ge_xS_{i-x}$/Si (100) Structures Produced by Pulsed Laser Mixing of Evaporated Ge on Si (100) Substrates", *Appl. Phys. Lett.,* vol. 52, 1988, p. 230, to name a few. Laser activation of ion implanted dopant has long been known as an alternative to conventional furnace annealing, see for example, A. E. Bell's "Review and Analysis of Laser Annealing", *RCA Review,* vol. 40, 1979, p. 295; and L. D. Hess et al. in "Applications of Laser Annealing in IC Fabrication"; in, J. Narayan et al., eds., *Laser-Solid Interactions and Transient Thermal Processing*

*of Materials,* Mat. Res. Soc. Symp. Proc., vol. 13, 1983, p. 337; and techniques such as Gas Immersion Laser Doping (GILD) have proven valuable in the formation of shallow junctions in bulk silicon, note R. J. Pressley's "Gas Immersion Laser Diffusion (GILDing)", in C. C. Tang, ed., "Laser Processing of Semiconductor Devices", *Proc. SPIE,* vol. 385, 1983, p. 30.; and K. H. Weiner and T. W. Sigmon's "Thin-Base Bipolar Transistor Fabrication Using Gas Immersion Laser Doping", *IEEE Electron Dev. Lett.,* vol. 10, 1989, p. 260. In addition, examination of excimer laser annealing of implant damage in bulk silicon has been demonstrated in the article by D. H. Lowndes et al., "Pulsed Excimer Laser (308 nm) Annealing of Ion Implanted Silicon and Solar Cell Fabrication", in J. Narayan et al., *Laser-Solid Interactions and Transient Thermal Processing of Materials,* Mat. Res. Soc. Symp. Proc., vol. 13, 1983, p. 407. These studies have, however, been limited to processing high quality bulk silicon, and have not explored the unique requirements of SOS.

Reports on laser processing SOS have not examined techniques required to solve materials problems for bipolar transistors and related demanding technologies. Yamada et al. performed thermally-assisted pulse laser annealing of SOS, see M. Yamada et al., "Thermally-Assisted Pulsed-Laser Annealing of SOS", in J. F. Gibbons et al., eds, *Laser and Electron-Beam Solid Interactions and Materials Processing,* Mat. Res. Soc. Symp. Proc., vol. 1, 1981, p. 503. Using Raman spectroscopy they measured the residual strain in annealed SOS due to the lattice mismatch between Si and sapphire. They performed no examination of laser dopant activation. Alestig et al. performed continuous wave (cw) laser annealing of ion implanted oxidized silicon layers on sapphire, see the article by G. Alestig et al., "CW Laser Annealing of Ion Implanted Oxidized Silicon Layers on Sapphire", in J Narayan et al., eds., *Laser-Solid Interactions and Transient Thermal Processing of Materials,* Mat. Res. Soc. Symp. Proc., vol. 13, 1983, p. 517. They demonstrated activation of boron and phosphorous dopants by illumination from both the top and backside of the wafer. They reported visible damage was obtained when using power sufficient to melt the silicon. Similarly, Hess et al. performed cw laser annealing of SOS to activate ion implanted dopant into MOS devices, see the article by L. D. Hess et al., "Laser-Assisted MOS/SOS Transistor Fabrication", in B. R. Appleton and G. K. Celler, eds., *Laser and Electron-Beam Interactions with Solids,* Mat. Res. Soc. Symp. Proc., vol. 4, 1982, p. 633. To prevent diffusion of dopant from the source or drain region into the gate region, the silicon was not melted to prevent spatial redistribution of the dopant. These references teach away from the use of melting SOS to prevent unwanted diffusion of dopant, and report decreased crystalline quality under these conditions.

Thus, a continuing need exists for a method of using a pulsed laser to perform a rapid melting of a select portion of a silicon island on sapphire, thereby diffusing dopant to electrically active sites without allowing time for undesirable diffusion along defect pipes to eliminate the problems associated with standard annealing techniques, to provide a uniform dopant profile desirable for bipolar bases, to effectively decouple the thermal activation of the emitter and base regions, and to provide for the advantage of fabricating functional devices in SOS material that has significant defects. The need further exists for such a technique that can be extended to fabrication of other semiconductor devices in SOS requiring activation of dopant atoms such as MOSFETs, CCDs, etc., and is amenable to process modifications to accommodate emerging materials, e.g. silicon-germanium alloys.

SUMMARY OF THE INVENTION

The present invention is directed to providing a method for the fabrication of bipolar junction transistors by laser-assisted dopant activation in silicon-on-sapphire (SOS). A patterned 100% aluminum mask is provided for an SOS wafer whose function is to reflect laser light from regions where melting of the silicon is undesirable (for example, in previously processed regions). The SOS wafer to be processed is then placed within an evacuated and inert atmosphere backfilled wafer carrier having a window transparent to the wavelength of the laser beam, to allow illumination of the masked wafer when the carrier is inserted into a processing chamber of a laser processing system including an in-situ reflectivity monitor to measure the melt duration of the silicon. The laser beam, typically emitted from an excimer laser, is shaped, homogenized, and at least one pulse is directed onto the SOS wafer to be processed. The laser pulse energy and pulse duration are set to obtain the optimal fluence impinging on the wafer in order to achieve the desired melt duration and corresponding junction depth. Alternately, an in-situ laser-assisted dopant incorporation process (referred to as GILD in the Background of the Invention, supra) where the patterned SOS wafer to be processed is placed within an evacuated and doping atmosphere backfilled wafer carrier having a window transparent to the wavelength of the laser beam, to allow illumination of the masked wafer when the carrier is inserted into a processing chamber of a laser processing system including an in-situ reflectivity monitor to measure the melt duration of the silicon. The laser beam, typically emitted from an excimer laser, is shaped, homogenized, and at least one pulse is directed onto the SOS wafer to be processed. The laser pulse energy and pulse duration are set to obtain the optimal fluence impinging on the wafer in order to achieve photolytic or pyrolytic decomposition of the doping ambient and subsequent dopant incorporation. Subsequent illuminations may be desired to redistribute the dopant in an inert ambient depending on the job at hand. Typical values used for bulk silicon and thick (at least one micrometer) epitaxial silicon layers on sapphire to achieve a base depth of 0.3 μm is a melt duration of about 100 ns ($\phi \sim 1.6$ J/cm$^2$); and an emitter depth of 0.15 μm is obtained with a melt duration of about 55 ns ($\phi = 1.2$ J/cm$^2$), where $\phi$ is the incident fluence. Dopant activation and rapid redistribution occurs in the wafer when the laser fluence is above the melt threshold and below the ablation threshold so that the wafer can be removed from the processing chamber for subsequent processing.

An object of the invention is to provide for a method of fabricating bipolar junction transistors in silicon-on-sapphire.

Another object is to provide a fabrication technique relying upon the application of laser activation of implanted dopant in such a manner as to electrically activate the dopant without allowing undesirable diffusion along crystallographic defects (diffusion pipes).

Another object is to provide a fabrication technique relying upon the application of an in-situ laser dopant incorporation process in such a manner as to electrically activate the dopant without allowing undesirable diffusion along crystallographic defects (diffusion pipes).

Another object is to provide a fabrication technique which accommodates a poor crystal quality of available silicon-on-sapphire material.

Another object is to provide a bipolar transistor fabrication technique capable of utilizing less than bulk quality silicon-on-sapphire films for bipolar applications with relaxed requirements to thereby potentially save costly epitaxy processing steps and subsequently increasing reliability and yield.

Another object is to provide a fabrication technique which enables the implementation of the combined benefits offered by laser processing and SOS which include no significant wafer stress, ultra-shallow dopant profiles for vertical scaling, narrow base widths, dopant profile customization in addition to full dielectric isolation, improved radiation hardness and low collector-to-substrate capacitance.

These and other objects of the invention will become more readily apparent from the ensuing specification and drawings when taken in conjunction with the appended claims.

DESCRIPTION OF THE PREFERRED EMBODIMENT

A fabrication process for semiconductor devices utilizes a pulsed laser activation of ion implanted dopant atoms. The process flow described below is representative of a self-aligned process for discrete bipolar transistors and test structures such as ring oscillators. It is to be understood that variations in this process flow for different devices, mask sets, etc., can be accommodated, when the novel aspects of this inventive concept disclosed herein are practiced by those skilled in the art.

Figure 1:
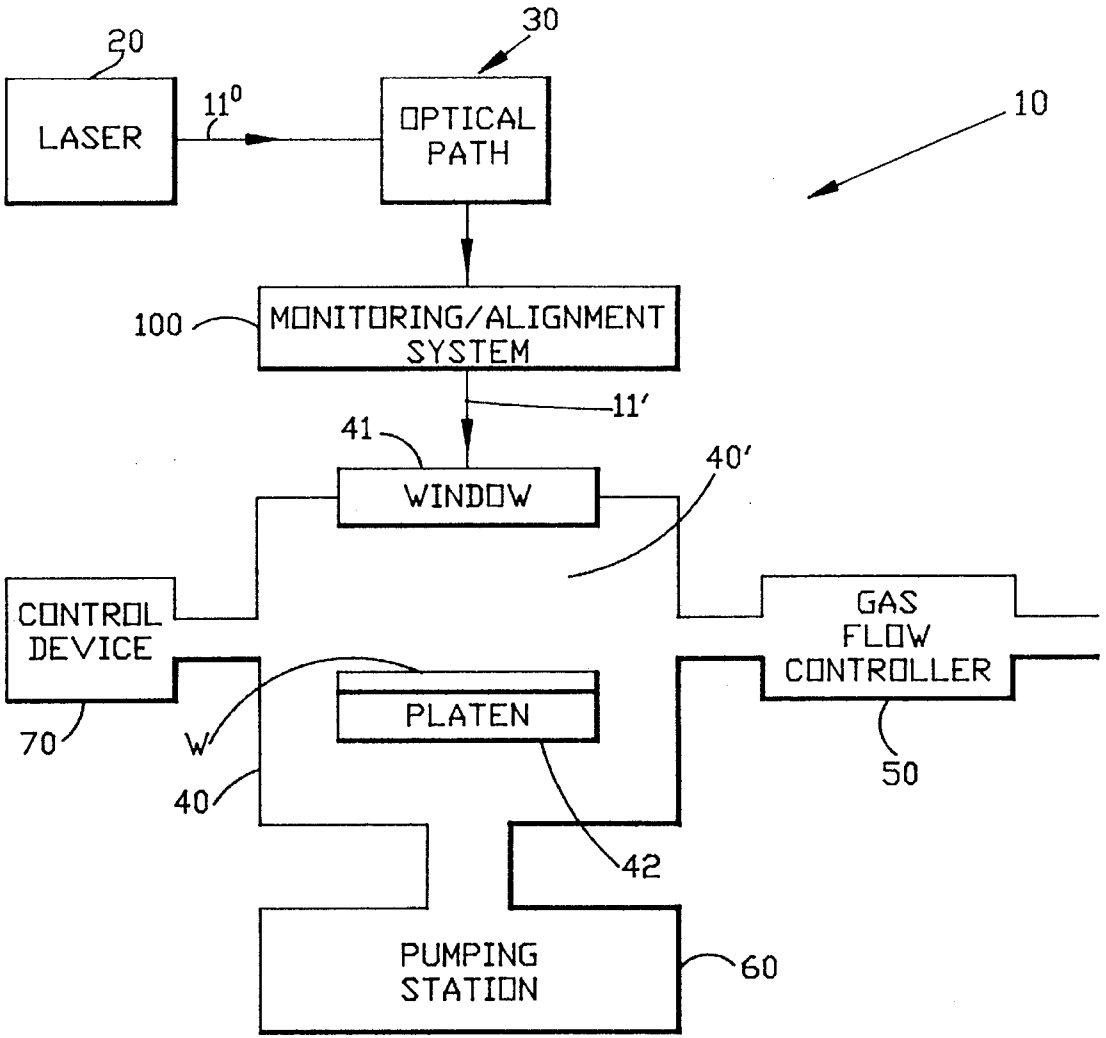
FIG. 1 is a schematic representation of the laser processing system associated with the aforedescribed process to enable the fabrication of semiconductor devices in accordance with this disclosed inventive concept.

The laser system utilized to practice this fabrication process for semiconductor devices in accordance with this inventive concept of utilizing an excimer laser activation of ion implanted dopant is schematically shown in FIG. 1 and is similar to that described in U.S. patent application No. 07/501,707 by S. D. Russell, et al., entitled "Method for Laser-Assisted Silicon Etching Using Halocarbon Ambients" (NC 71,978) which also includes an in-situ reflectivity monitor to measure the melt duration of the silicon or other semiconductor material.

Laser processing system 10 includes an excimer laser 20 that emits a beam 11° through an optical path system 30. The optical path system homogenizes, shapes and directs a beam 11' through a laser beam transparent window 41 into a processing chamber system 40 containing a suitable ambient gas 40' and onto a silicon or other suitable semiconductor wafer W or wafer die or packaged device which may be mounted on a platen 42.

A gas mass flow controller system 50 is used to flow and pressurize the suitable ambient gas and purge gases with respect to the processing chamber system. Removal of initial ambient or reaction by-products is accomplished via a pumping station 60 connected to the process chamber system. A capacitive manometer-process control device 70, for example, is attached to the process chamber to monitor the pressure of the suitable ambient gas. In situ monitoring/alignment system 100 is included for positioning of wafer W where the laser beam which will impinge on the wafer. System 100 may also include a beam diagnostic system, a reflectivity monitor, a laser alignment system, an in-situ monitoring system, and a temporal profile and energy measurement system which may be included to calibrate incident laser fluence. The details of the typical constituents of examples of these systems can be gleaned from the above referenced application and will make an implementation and/or variations readily apparent to those skilled in the art so that an appreciation of the salient features of this inventive concept can be made known.

FIGS. 2–7 schematically show the process flow used for laser-assisted fabrication of bipolar transistors in SOS. A discrete npn transistor is shown for simplicity; similarly, vertical dimensions in these figures are exaggerated for clarity and do not represent the scale of the devices.

Figure 2:
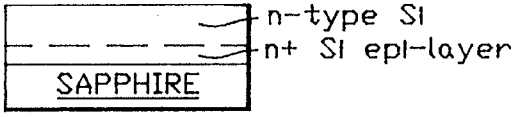
FIG. 2 shows a cross-section of a starting SOS material consisting of an epitaxially grown n-type layer on a $n^+$ layer on sapphire which acts as the buried collector.
Figure 3:
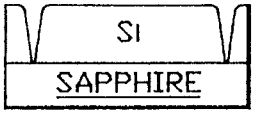
FIG. 3 depicts a structure of delineated silicon islands after a patterned potassium hydroxide etch.
Figure 4:
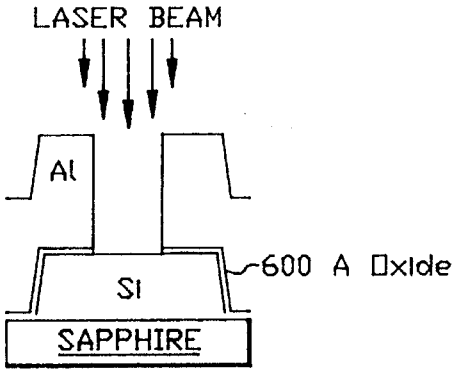
FIG. 4 shows laser activation of the implanted base region and redistribution of the dopant.
Figure 5:
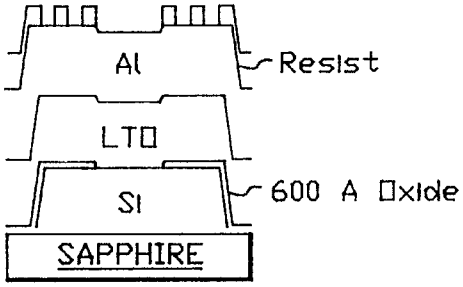
FIG. 5 shows the photolithographic patterning to define areas for subsequent implantation and laser processing.
Figure 6:
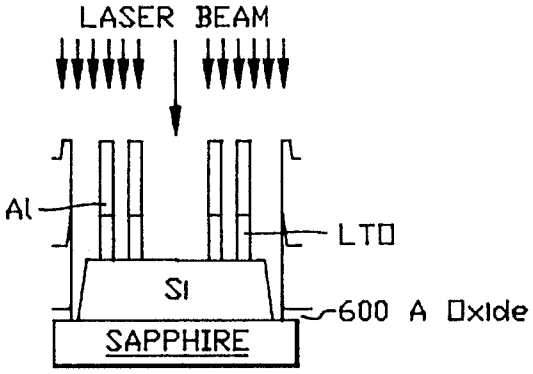
FIG. 6 depicts a final laser processing step that simultaneously activates the emitter, collector, and the extrinsic base regions without affecting the intrinsic base junction depth.
Figure 7:
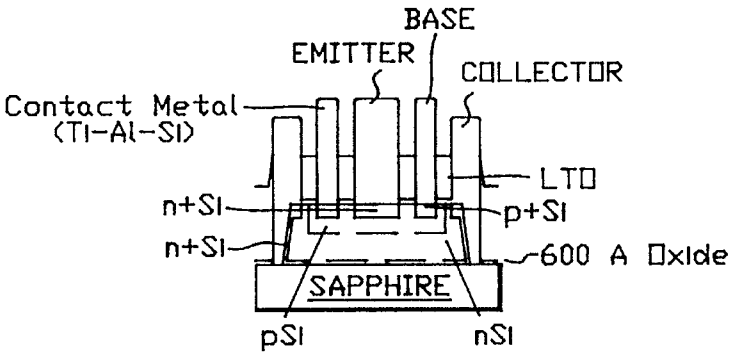
FIG. 7 shows a functional bipolar device after the step of sintering the device to form ohmic contact with the junctions.

FIG. 2 shows the cross-section of the starting SOS material consisting of an epitaxially grown n-type layer on an $n^+$ layer on sapphire which acts as the buried collector. The $n^+$ first epi-layer has received the DSPE improvement process discussed in the Background of the Invention, supra, or may be fabricated by alternate means which exhibit sufficient quality for epitaxial deposition. The wafers receive a standard clean prior to the growth of 1 KÅ of thermal oxide. The isolation mask photolithography (photo) step follows which delineates the silicon islands for dielectric isolation formed by subsequent buffered oxide etch (BOE), photoresist removal by oxygen plasma etching (ashing), and potassium hydroxide (KOH) etch of the silicon. The remaining oxide is then etched resulting in the structure shown in FIG. 3.

The wafers receive a standard clean prior to the growth of 600 Å of thermal oxide, and deposition of 7 KÅ of 100% aluminum (Al). The high reflectivity of the aluminum allows masking for selective laser processing on the wafers. The intrinsic base photo follows, with wet or dry etching of the aluminum to open areas to receive ion implanted dopant atoms. The intrinsic base junction obtains a shallow implant of boron atoms (of typical dose $2\times10^{13}/cm^2$ at 35 keV). The capping oxide is then wet or dry etched and the photoresist ashed to allow laser activation of the implanted base region and redistribution of the dopant controlled by the laser system (FIG. 4) in accordance with this inventive concept to be discussed in detail below.

Maximum melt depths of about 0.35 μm are obtained with melt durations of about 120 nsec. Typical intrinsic bases suitable for shallow bipolar transistors are formed with metallurgical junctions about 0.3 μm using 100 nsec melt durations ("~1.6 J/cm$^2$).

The Al mask is removed with a wet (Caros) etch, followed by a standard clean and the deposition of 5 KÅ of Low Temperature Oxide (LTO). Deposition of 7 KÅ of 100% Al follows, to be patterned for the final laser mask. The contact photo step is completed (FIG. 5), in order to define areas for later implantation and laser processing. The Al is wet etched, and the resist reflowed prior to plasma etching of the oxide, and ashing of the resist. These steps may be replaced with a dry etching process, if desired, without affecting the inventive concept disclosed herein. The extrinsic base photo and implant ($5\times10^{15}BF_2/cm^2$ at 25 keV) follow, and the resist is ashed. The emitter/collector photo and implant ($3\times10^{15}$ As/cm$^2$ at 50 keV) are completed and the resist ashed. The final laser processing step is completed with melt durations between about 20 to about 100 nsec depending on the desired base width. This simultaneously activates the emitter, collector contact, and the extrinsic base regions without affecting the intrinsic base junction depth, see FIG. 6, in accordance with this inventive concept to be discussed in detail below.

The Al mask is removed by a wet (Caros) etch. At this stage, a conventional rapid thermal anneal (RTA) may be employed to further anneal ion implant straggle damage. Residual implant damage does not exist if the in-situ dopant incorporation (GILD) process discussed in the Background of the Invention, supra, is used. In that case, and those with careful process controls, the RTA step can be eliminated. Conventional metallization steps follow including: a standard clean, 10:1 hydrofluoric (HF) acid dip to clear native oxide, deposition of 1 KÅ titanium (Ti) and 10 KÅ of 99%AL-1%Si. Patterning of the metal includes a photo step, wet etching the Al and Ti, dehazing (removing Si deposits), and ashing the resist. Finally, sintering of the device to form ohmic contact with the junctions provides the functional bipolar device shown in FIG. 7.

Figure 8:
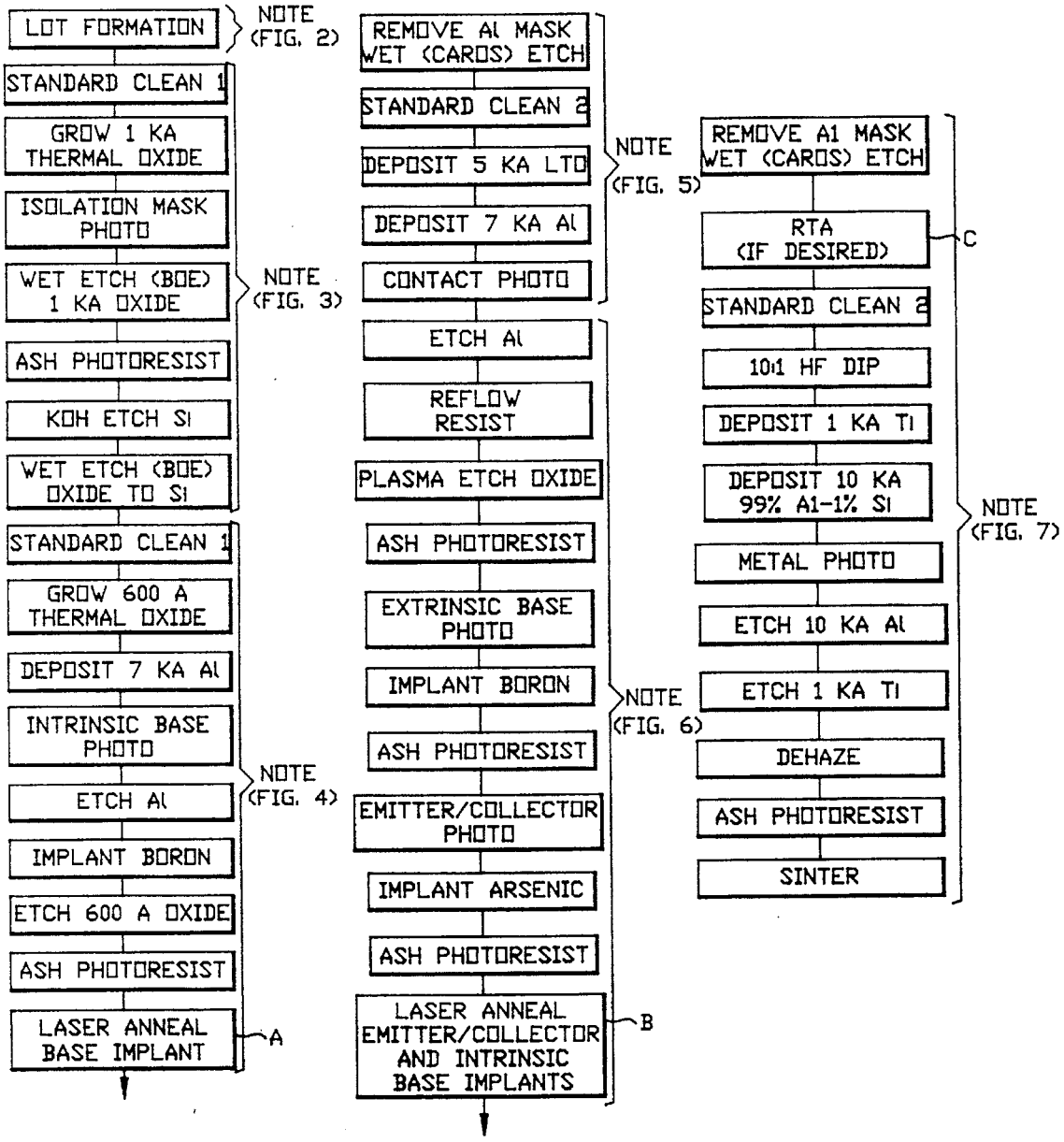
FIG. 8 is a block diagram setting forth the process flow described above.

The aforedescribed process flow with figure correlations to the above sequence is summarized in FIG. 8 with the associated braces relating the steps of the process to the figures of the drawings. The method for laser-assisted dopant activation in SOS involves the above identified steps which are used to provide a patterned 100% aluminum mask whose function is to reflect the laser light from regions where melting of the silicon is undesirable (for example, in previously processed regions). The SOS wafer W to be processed is then placed within a chamber such as that referred to above or, optionally, the wafer may be placed in a wafer carrier, not shown, that is evacuated and backfilled with an inert atmosphere. Like the aforedescribed chamber 40, the wafer carrier is provided with a window transparent to the wavelength of the laser beam, allowing illumination of the masked wafer after the wafer carrier is inserted into the laser processing system of FIG. 1.

Figure 9:
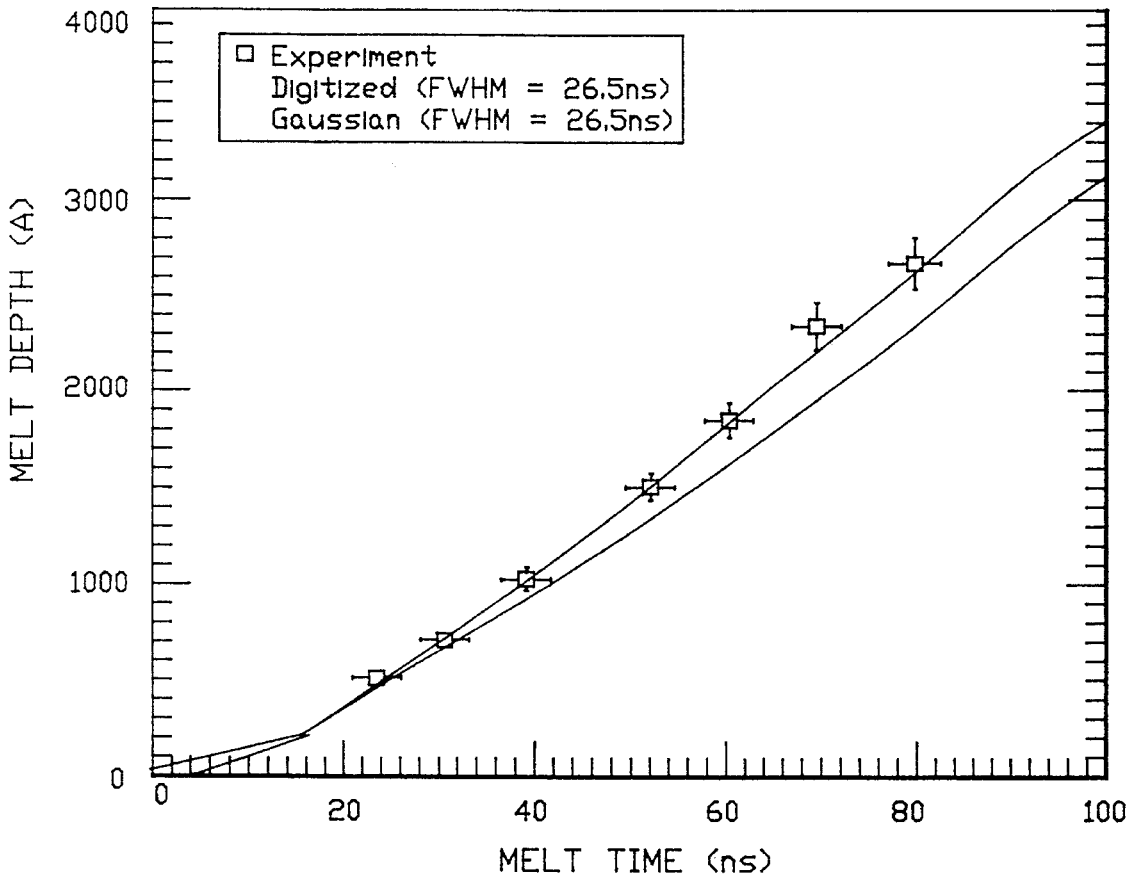
FIG. 9 is a graph depicting the relationship between melt duration and desired junction depth for bulk silicon and thick epitaxial silicon layers on sapphire.
Figure 10:
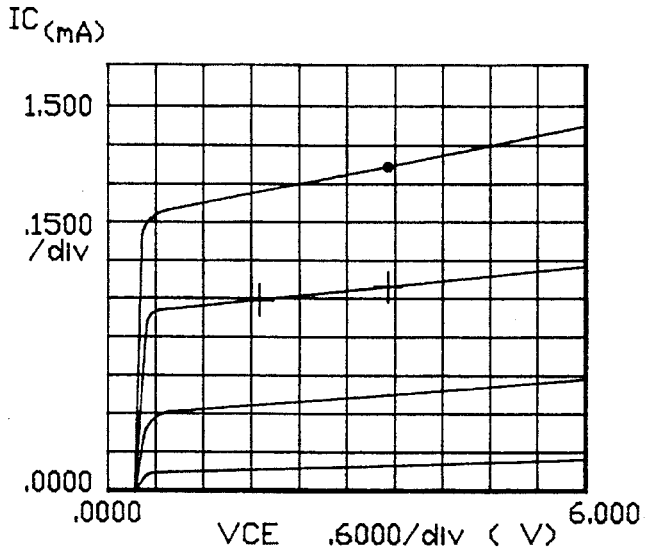
FIG. 10 shows $I_C$ versus $V_{CE}$ for npn bipolar transistor common emitter in SOS fabricated using the process of this inventive concept.

Excimer laser beam 11° is shaped, homogenized, and then one or more pulses 11' are directed onto the wafer to be processed in accordance with the process steps as indicated by "A" and "B" in FIG. 8. The laser pulse energy and pulse duration are set to obtain the optimal fluence impinging on the wafer in order to achieve the desired melt duration and corresponding junction depth. The relationship among these parameters for bulk silicon and thick (at least one micrometer) epitaxial silicon layers on sapphire are shown in FIG. 9 for a XeCl excimer laser operating at 308 nm wavelength. Typical values used to achieve a base depth of 0.3 μm is a melt duration of about 100 ns (ø~1.6 J/cm$^2$); and an emitter depth of 0.15 μm is obtained with a melt duration of about 55 ns (ø=1.2 J/cm$^2$). The range of available melt durations, without ablating, is from about 20 nsec to about 120 nsec corresponding to junction depths of about 100 Å to about 3500 Å. The melt regime is between about 0.4 J/cm$^2$ and about 2.5 J/cm$^2$ with an excimer laser beam wavelength of 308 nm. These numbers vary with laser pulse duration, wavelength, gas mixture, and material properties and such variations will be readily accommodated by the teachings disclosed herein. Activation and rapid dopant redistribution occurs when the laser fluence is above the melt threshold and below the ablation threshold. Furthermore, both lateral and vertical undesirable diffusion is inhibited by this laser process. After the wafer is processed in accordance with the process steps as indicated by "A" and "B" in FIG. 8, the wafer is removed from the processing chamber or wafer carrier for subsequent processing. Heretofore, the conventional processing techniques have proved unworkable in the fabrication of bipolar transistors in SOS; however, this fabrication process is workable for the first narrow base-width (high gain) bipolar transistors in SOS. Referring to FIG. 10 $I_c$ versus $V_{ce}$ is shown for an npn bipolar transistor common emitter in SOS fabricated using the disclosed process (without a rapid thermal anneal (RTA) treatment at "C" in FIG. 8) and maximum current gain (β) approaching 100 has been obtained without optimization of design. A most significant new feature of the application of laser activation of implanted dopant in SOS is the electrical activation of the dopant without allowing undesirable diffusion along crystallographic defects (diffusion pipes). As a consequence, this process accommodates the poor crystal quality of available SOS material. Therefore, the requirements to achieve bulk quality SOS films for bipolar applications may be relaxed, to potentially save costly and complicated epitaxy processing steps thereby increasing reliability and yield. In addition, this process enables the implementation of the combined benefits offered by laser processing and SOS which include no significant wafer heating, ultra-shallow dopant profiles for vertical scaling, narrow base widths, dopant profile customization in addition to full dielectric isolation, improved radiation hardness and low collector to substrate capacitance.

This process is designed to minimize problems associated with SOS material quality; however, the process can be used for bulk Si, and other SOI technologies. The converse is not true, conventional processing techniques cannot be used for the fabrication of devices in SOS.

In addition, this process may be extended to processing on materials to inhibit unwanted diffusion of dopant in both vertical and lateral device structures.

An alternative which may be beneficial in some applications is the use of the laser process to activate only the emitter/collector implant after conventional furnace annealing of the base implant, or only laser activate the emitter implant. These variations in the process also generates functional devices since diffusion of dopant along the crystallographic defect pipes is minimal, preventing emitter-collector shorts.

Application of the in-situ dopant incorporation (GILD) process described in the Background of the Invention supra, will also enable laser activation of the dopant by the optional replacing of the two-step implantation/laser anneal process disclosed in the preferred embodiment. In this case a doping ambient with pressures near or below one atmosphere (between $10^{-4}$ torr to 2000 torr) is decomposed by the laser and redistributed into the semiconductor film. Typically, the doping ambient could be boron trifluoride, arsine or phosphine, for example, although others could be chosen under appropriate conditions.

The 100% Al mask referred to above has demonstrated highest reflectivity when deposited without preheating the wafer, and in a load locked sputtering system. The higher reflectivity allows the use of higher laser fluences to achieve greater melt (junction) depths without ablation of the mask at UV wavelengths. Variations in masking schemes may be appropriate for different laser systems, for example, changing the metal used and/or metal thickness, masking with oxides or even maskless processing by projecting the laser beam in a desired pattern. However, masks which are predominantly aluminum have been demonstrated appropriate for excimer laser processing.

Variations of Si layer thickness will also require modifications of the method disclosed above due to variation of the thermal properties of the sapphire substrate as compared to bulk silicon. Laser wavelength may be varied in order to vary the decomposition mechanism of the ambient gas described in the in-situ dopant incorporation (GILD) process, and the absorption depth in the sample to optimize specific production requirements, for example ultra-shallow junctions.

This process may also be extended to other materials and structures, for example, Ge-Si heterojunction bipolar transistors (HBTs), since shallow penetration depths and rapid annealing are desirable in similar technologies.

Obviously, many modifications and variations in the above described process flow may be made for different devices, mask sets, etc., and are possible in the light of the above teachings. It is therefore to be understood that within the scope of the appended claims the invention may be practiced otherwise than as specifically described.

We claim:

1. A method for laser-assisted dopant activation and rapid dopant redistribution while inhibiting the creation of undesirable diffusion in a silicon-on-sapphire wafer comprising:

placing said silicon-on-sapphire wafer in an appropriate ambient; and generating an appropriately shaped and spatially homogenized laser beam having a pulse energy and pulse duration preset to above the melt threshold and below the ablation threshold of said silicon of said silicon-on-sappire wafer to obtain a predetermined optimal fluence in order to achieve a desired melt duration and corresponding junction depth; and directing said appropriately shaped and homogenized laser beam of at least one pulse onto said silicon-on-sapphire wafer in a predetermined processing location thereon to ensure said dopant activation and said rapid dopant redistribution while said inhibiting the creation of undesirable diffusion in said silicon-on-sapphire wafer.

2. A method according to claim 1 further including:

providing a patterned mask on said silicon-on-sapphire wafer to reflect impinging emissions from regions on said silicon-on-sapphire wafer where melting of the silicon is undesirable to achieve said predetermined processing location.

3. A method according to claim 1 in which the thickness of said silicon on said silicon-on-sapphire wafer is at least 1 micrometer and said corresponding junction depth is defined therein.

4. A method according to claim 2 in which the thickness of said silicon on said silicon-on-sapphire wafer is at least 1 micrometer and said corresponding junction depth is defined therein.

5. A method according to claims 1, 2, 3 or 4 in which the step of said generating is with said pulse energy between 0.4 $J/cm^2$ and 2.5 $J/cm^2$ with said laser beam at a wavelength of 308 nm.

6. A method according to claim 5 in which the step of said generating is with said desired melt duration between 20 nsec and 120 nsec.

7. A method according to claim 2 further including:

the step of said providing of said patterned mask on said silicon-on sapphire wafer is a mask of predominantly composed of aluminum.

8. A method for laser-assisted dopant activation and rapid dopant redistribution to create a bipolar junction transistor on a silicon-on-sapphire wafer while inhibiting the creation of undesirable diffusion in the creation of said bipolar junction transistor comprising:

placing said silicon-on-sapphire wafer in an appropriate ambient; and generating an appropriately shaped and spatially homogenized laser beam having a pulse energy and pulse duration preset to above the melt threshold and below the ablation threshold of said silicon of said silcon-on-sapphire wafer to obtain a predetermined optimal fluence in order to achieve a desired melt duration and corresponding junction depth; and directing said appropriately shaped and homogenized laser beam of at least one pulse onto said silicon-on-sapphire wafer in a predetermined processing location thereon to ensure said dopant activation and said rapid dopant redistribution while said inhibiting the creation of undesirable diffusion in the creation of said bipolar junction transistor on said silicon-on-sapphire wafer.

9. A method according to claim 8 further including:

providing a patterned mask on said silicon-on-sapphire wafer to create said bipolar junction transistor by reflecting impinging emissions from regions on said silicon-on-sapphire wafer where melting of the silicon is undesirable to achieve said predetermined processing location.

10. A method according to claim 8 in which the thickness of said silicon on said silicon-on-sapphire wafer is at least 1 micrometer and said corresponding junction depth in said bipolar junction transistor is defined therein.

11. A method according to claim 9 in which the thickness of said silicon on said silicon-on-sapphire wafer is at least 1 micrometer and said corresponding junction depth in said bipolar junction transistor is defined therein.

12. A method according to claims 8, 9, 10 or 11 in which the step of said generating is with said pulse energy between 0.4 $J/cm^2$ and 2.5 $J/cm^2$ with said laser beam at a wavelength of 308 nm.

13. A method according to claim 12 in which the step of said generating is with said desired melt duration between 20 nsec and 120 nsec.

14. A method according to claim 9 further including:

the step of said providing of said patterned mask on said silicon-on sapphire wafer is a mask of predominantly composed of aluminum.

15. A method for in-situ laser-assisted dopant incorporation, dopant activation and rapid dopant redistribution while inhibiting the creation of undesirable diffusion in a silicon-on-sapphire wafer comprising:

placing said silicon-on-sapphire wafer in an appropriate doing ambient; and generating an appropriately shaped and spatially homogenized laser beam having a pulse energy and pulse duration preset to above the melt threshold and below the ablation threshold of said silicon of said silicon-on-sapphire wafer to obtain a predetermined optimal fluence in order to achieve a desired melt duration and corresponding junction depth; and directing said appropriately shaped and homogenized laser beam of at least one pulse onto said silicon-on-sapphire wafer in a predetermined processing location thereon to ensure said dopant incorporation, said dopant activation and said rapid dopant redistribution while said inhibiting the creation of undesirable diffusion in said silicon-on-sapphire wafer.

16. A method according to claim 15 further including:

providing a patterned mask on said silicon-on-sapphire wafer to reflect impinging emissions from regions on said silicon-on-sapphire wafer where melting of the silicon is undesirable to achieve said predetermined processing location.

17. A method according to claim 15 in which the thickness of said silicon on said silicon-on-sapphire wafer is at least 1 micrometer and said corresponding junction depth is defined therein.

18. A method according to claim 16 in which the thickness of said silicon on said silicon-on-sapphire wafer is at least 1 micrometer and said corresponding junction depth is defined therein.

19. A method according to claims 15, 16, 17 or 18 in which the step of said generating is with said pulse energy between 0.4 $J/cm^2$ and 2.5 $J/cm^2$ with said laser beam at a wavelength of 308 nm.

20. A method according to claim 19 in which the step of said generating is with said desired melt duration between 20 nsec and 120 nsec.

21. A method according to claim 16 further including:

the step of said providing of said patterned mask on said silicon-on sapphire wafer is a mask of predominantly composed of aluminum.

22. A method according to claim 15 in which said doping ambient is at a pressure of between $10^{-4}$ torr to 2000 torr.

23. A method for laser-assisted dopant incorporation, dopant activation and rapid dopant redistribution to create a bipolar junction transistor while inhibiting the creation of undesirable diffusion in the creation of said bipolar junction transistor on a silicon-on-sapphire wafer while inhibiting the creation of undesirable diffusion in the creation of said bipolar junction transistor comprising:

placing said silicon-on-sapphire wafer in an appropriate doping ambient; and generating an appropriately shaped and spatially homogenized laser beam having a pulse energy and pulse duration preset to above the melt threshold and below the ablation threshold of said silicon of said silicon-on-sapphire wafer to obtain a predetermined optimal fluence in order to achieve a desired melt duration and corresponding junction depth; and directing said appropriately shaped and homogenized laser beam of at least one pulse onto said silicon-on-sapphire wafer in a predetermined processing location thereon to ensure said dopant incorporation, said dopant activation and said rapid dopant redistribution while said inhibiting the creation of undesirable diffusion in the creation of said bipolar junction transistor on said silicon-on-sapphire wafer.

24. A method according to claim 23 further including:

providing a patterned mask on said silicon-on-sapphire wafer to create said bipolar junction transistor by reflecting impinging emissions from regions on said silicon-on-sapphire wafer where melting of the silicon is undesirable to achieve said predetermined processing location.

25. A method according to claim 23 in which the thickness of said silicon on said silicon-on-sapphire wafer is at least 1 micrometer and said corresponding junction depth in said bipolar junction transistor is defined therein.

26. A method according to claim 24 in which the thickness of said silicon on said silicon-on-sapphire wafer is at least 1 micrometer and said corresponding junction depth in said bipolar junction transistor is defined therein.

27. A method according to claims 23, 24, 25 or 26 in which the step of said generating is with said pulse energy between 0.4 $J/cm^2$ and 2.5 $J/cm^2$ with said laser beam at a wavelength of 308 nm.

28. A method according to claim 27 in which the step of said generating is with said desired melt duration between 20 nsec and 120 nsec.

29. A method according to claim 24 further including:

the step of said providing of said patterned mask on said silicon-on sapphire wafer is a mask of predominantly composed of aluminum.

30. A method according to claim 23 in which the said doping ambient is at a pressure between $10^{-4}$ torr to 2000 torr.

* * * * *